US008852378B2

(12) United States Patent  (10) Patent No.: US 8,852,378 B2
Huff et al.  (45) Date of Patent: Oct. 7, 2014

(54) TAILORABLE TITANIUM-TUNGSTEN ALLOY MATERIAL THERMALLY MATCHED TO SEMICONDUCTOR SUBSTRATES AND DEVICES

(75) Inventors: Michael A. Huff, Oakton, VA (US); Paul Sunal, Arlington, VA (US)

(73) Assignee: Corporation for National Research Initiatives, Reston, VA (US)

( * ) Notice: Subject to any disclaimer, the term of this patent is extended or adjusted under 35 U.S.C. 154(b) by 800 days.

(21) Appl. No.: 12/458,073

(22) Filed: Jun. 30, 2009

(65) Prior Publication Data

US 2010/0108254 A1    May 6, 2010

Related U.S. Application Data

(60) Provisional application No. 61/129,736, filed on Jul. 15, 2008.

(51) Int. Cl.
*C22C 1/00* (2006.01)
*H01L 23/373* (2006.01)
*C22C 1/04* (2006.01)
*H01L 23/473* (2006.01)
*H01S 5/024* (2006.01)
*H01S 5/40* (2006.01)

(52) U.S. Cl.
CPC ............ *C22C 1/00* (2013.01); *H01L 23/3736* (2013.01); *C22C 1/045* (2013.01); *H01S 5/02476* (2013.01); *H01S 5/02423* (2013.01); *H01S 5/4025* (2013.01); *H01L 23/473* (2013.01)
USPC .......................................... 156/281; 427/250

(58) Field of Classification Search
CPC . H01L 23/38; H01L 21/4882; H01L 23/3672; H01L 33/44; H01L 33/505
USPC ............... 438/55; 257/E23.103, 98, E23.082; 156/281; 427/250
See application file for complete search history.

(56) References Cited

U.S. PATENT DOCUMENTS

| | | | |
|---|---|---|---|
| 6,355,362 B1 * | 3/2002 | Jones et al. | 428/614 |
| 2002/0021138 A1 * | 2/2002 | Budnaitis et al. | 324/760 |
| 2006/0151801 A1 * | 7/2006 | Doan et al. | 257/99 |
| 2006/0186535 A1 * | 8/2006 | Baker et al. | 257/720 |
| 2008/0265403 A1 * | 10/2008 | Cornie et al. | 257/706 |
| 2009/0278233 A1 * | 11/2009 | Pinnington et al. | 257/615 |
| 2009/0309199 A1 * | 12/2009 | Barkley | 257/676 |

* cited by examiner

*Primary Examiner* — Stephen W Smoot
*Assistant Examiner* — Edward Chin
(74) *Attorney, Agent, or Firm* — Nixon & Vanderhye, PC (57) ABSTRACT

The present invention relates generally to a metallic alloy composed of Titanium and Tungsten that together form an alloy having a Coefficient of Thermal Expansion (CTE), wherein the content of the respective constituents can be adjusted so that the alloy material can be nearly perfectly matched to that of a commonly used semiconductor and ceramic materials. Moreover, alloys of Titanium-Tungsten have excellent electrical and thermal conductivities making them ideal material choices for many electrical, photonic, thermoelectric, MMIC, NEMS, nanotechnology, power electronics, MEMS, and packaging applications. The present invention describes a method for designing the TiW alloy so as to nearly perfectly match the coefficient of thermal expansion of a large number of different types of commonly used semiconductor and ceramic materials. The present invention also describes a number of useful configurations wherein the TiW material is made as well as how it can be shaped, formed and polished into heat sink, heat spreaders, and electrodes for many applications. The present invention also discloses the direct bonding of a TiW substrate to a semiconductor substrate.

34 Claims, 8 Drawing Sheets

| Material Type | Material | Coefficient of Thermal Expansion (x10-6/degree Celsius) |
|---|---|---|
| Metals | Aluminum (Al) | 23.1 |
| | Copper (Cu) | 16.5 |
| | Gold (Au) | 14.2 |
| | Silver (Ag) | 18.9 |
| | Titanium (Ti) | 8.6 |
| | Tungsten (W) | 4.5 |
| Ceramics | Alumina (Al2O3) | 6.3 |
| | Beryllia (BeO) | 7.2 |
| | Kovar (nickel-cobalt ferrous alloy) | 5.1 |
| Semiconductors | Aluminum Nitride (AlN) | 5.3 |
| | Gallium Arsenide (GaAs) | 5.8 |
| | Indium Arsenide (InAs) | 4.5 |
| | Gallium Antimonide (GaSb) | 7.8 |
| | Gallium Phosphide (GaP) | 4.7 |
| | Aluminum Gallium Arsenide (AlxGa(1-x)As) | (5.73-.53x) |
| | Indium Gallium Arsenide (GaxIn(1-x)As) | 5.66 |
| | Gallium Nitride (GaN) | 5.6 |
| | Indium Phosphide (InP) | 4.6 |
| | Germanium (Ge) | 5.9 |
| | Silicon Germanium (Si(1-x)Gex) | $(2.6+2.55x)$ for $x < 0.85$ & $(7.53x - .89)$ for $x > .85$ |
| | Indium Antimonide (InSb) | 5.37 |
| | Silicon Carbide (6H, ac) | 4.7 |

| Material Type | Material | Coefficient of Thermal Expansion (x 10-6/degree Celsius) |
|---|---|---|
| Ceramics | Alumina (Al2O3) | 6.3 |
| | Beryllia (BeO) | 7.2 |
| | Kovar (nickel-cobalt ferrous alloy) | 5.1 |
| Semiconductors | Aluminum Nitride (AlN) | 5.3 |
| | Gallium Arsenide (GaAs) | 5.8 |
| | Indium Arsenide (InAs) | 4.5 |
| | Gallium Antimonide (GaSb) | 7.8 |
| | Gallium Phosphide (GaP) | 4.7 |
| | Aluminum Gallium Arsenide (AlxGa(1-x)As) | (5.73-.53x) |
| | Indium Gallium Arsenide (GaxIn(1-x)As) | 5.66 |
| | Gallium Nitride (GaN) | 5.6 |
| | Indium Phosphide (InP) | 4.6 |
| | Germanium (Ge) | 5.9 |
| | Silicon Germanium (Si(1-x)Gex) | (2.6+2.55x) for x < 0.85 & (7.53x - .89) for x > .85 |
| | Indium Antimonide (InSb) | 5.37 |
| | Silicon Carbide (6H, ac) | 4.7 |

TAILORABLE TITANIUM-TUNGSTEN ALLOY MATERIAL THERMALLY MATCHED TO SEMICONDUCTOR SUBSTRATES AND DEVICES

This application claims the benefit of Provisional Application No. 61/129,736, filed Jul. 15, 2008, the entire contents of which are hereby incorporated by reference in this application.

FIELD OF THE INVENTION

The present invention relates generally to a metallic alloy composed of Titanium and Tungsten that together form an alloy having a Coefficient of Thermal Expansion (CTE) that can be adjusted by adjusting the content of the constituent metals so that the CTE of the alloy metal nearly perfectly matches that of commonly used semiconductor and ceramic materials. Alloys of Titanium-Tungsten have excellent electrical and thermal conductivities making them ideal material choices for many electrical, photonic, packaging and MEMS applications.

BACKGROUND OF THE INVENTION

Metal and metal alloy materials are used in many semiconductor applications, including electronics, microelectronics, photonics, Micro-Electro-Mechanical Systems (MEMS), Nano-Electro-Mechanical Systems (NEMS), power electronics, Monolithic Microwave Integrated Circuits (MMICs), thermoelectrics, nanotechnology and combinations thereof. Specifically, metal and metal alloys are used as packages, substrate carriers, heat sinks, thermal spreaders, electrodes, etc. in such applications.

These metal or metal alloys can be directly attached, joined or bonded to semiconductor substrates to serve one or more of the following purposes. First, the metal or metal alloy substrates can be used to provide increased mechanical stiffness and strength to fragile semiconductor substrates. Most semiconductors are typically made from single-crystal materials, specifically of the so-called group IV, such as Silicon (Si), or from group III-V and II-VI semiconductor compounds, such as Gallium Arsenide (GaAs), Indium Phosphide (InP), etc., which can be prone to fracture along the crystallographic planes of the material. This is especially true if the semiconductor substrate has been thinned down considerably, which is frequently done to improve the heat transfer from the semiconductor to a heat sink or heat spreader. Therefore, the bonding, joining, or attachment of a metal substrate to a semiconductor substrate, or a metal substrate to a semiconductor substrate mounted on a ceramic substrate, makes the semiconductor substrate less susceptible to breakage during normal handling, as well as during subsequent fabrication, die separation and packaging processes.

Second, the bonding, joining or attachment of a metal substrate to a semiconductor substrate is frequently performed in order to provide electrical connection(s) to the semiconductor. For example, many semiconductor substrates containing active and passive device(s) are often mated to a metal substrate that provides an electrical connection to the semiconductor material so as to provide electrical currents and voltages to the semiconductor(s) devices to enable them to operate.

Third, the bonding, joining or attachment of a metal substrate to a semiconductor substrate is frequently performed in order to provide the ability to efficiently transport heat away from the device(s) fabricated in the semiconductor substrate. For example, the metal substrate may function as a thermal heat sink or thermal heat spreader to the semiconductor device(s). During operation a semiconductor device may heat up very significantly with the result that the semiconductor device will experience an elevated temperature or even overheat, thereby negatively impacting the performance and reliability of the semiconductor device. Placing the semiconductor on a metal substrate having a high thermal conductance allows excess heat to be more effectively transported away from the semiconductor device, thereby enabling the temperature of the semiconductor device to be better regulated or maintained at acceptable levels during operation. In some applications, the metal heat sinks may employ cooling fins, fluid channels or other fluid handling structural shapes or elements to facilitate an increased heat transfer rate from the metal to a cooling fluid or cooling device. For example, channels through which a coolant fluid, such as water, can flow may be fabricated into the metal heat sink to increase the heat transfer from the semiconductor to the coolant fluid.

Fourth, the bonding, joining or attachment of a semiconductor substrate to a metal substrate may be performed to facilitate the packaging of the semiconductor device(s). In general, packaging of semiconductor device(s) is performed in order to serve a number of goals that typically include one or more of the following: (1) protect the semiconductor device(s) from the environment; (2) facilitate the electrical connection to the semiconductor device(s); (3) facilitate the electrical connection of the semiconductor device(s) to the environment; (4) protect the semiconductor device(s) from damage during use and handling; and/or, (5) keep the semiconductor device(s) clean from dust and other airborne particulate matter.

Despite the reasons and merits of bonding, joining or attachment a semiconductor substrate to a metallic substrate, it is understood and recognized that many of the currently available and commonly used metal substrates have many disadvantages and shortcomings, as described herein.

Specifically, any differences in the respective Coefficient of Thermal Expansion (CTE) between the semiconductor and the metal substrate can result in large "built-in" residual stresses that can have detrimental effects on the semiconductor device performance. For example, if a soldering material is used to mate a semiconductor to a metal substrate, the temperature of the mating process must be performed at approximately the melting or alloying temperature of the soldering material, which is typically well over one-hundred degrees Celsius. Metals usually have relatively large coefficients of thermal expansion, whereas semiconductors have comparatively lower coefficients of thermal expansion, and therefore, the differing thermal expansion coefficients of the materials in this system, combined with the elevated temperatures required to perform the soldering process, can result in large built-in stresses between the mated substrates once they are cooled to room temperature.

Additionally, most semiconductor devices heat up very significantly during operation and can result in thermal stresses and strains to develop between the semiconductor device and the metal substrate it is mounted to. Specifically, this operational heating combined with the differing coefficients of thermal expansion results in a thermal stress and strain on the semiconductor devices.

These built-in stresses frequently result in many negative consequences for the performance of semiconductor device(s). For example, it is well known that most semiconductors device(s) can have their bandgaps and energy levels modified by the application of mechanical strains on the substrate material due to the piezoresistive and other effects in semiconductors. Consequently, if the mating process or operational heating results in built-in stresses, these built-in stresses can cause the bandgaps and energy states in the semiconductor material to be altered, thereby modifying the device behavior such as shifting the wavelength of the laser radiation for a solid-state laser diode or modification of the turn-on voltage for a solid state transistor.

Furthermore, large built-in stresses have been known to appreciably lower the reliability of semiconductor devices. For example, most semiconductor devices heat-up due to the power dissipated during operation thereby resulting in a thermal strain to develop between the mated materials. As stated before, this thermal strain is mostly due to the differing thermal expansion coefficients of the materials used in these systems, wherein most of the metals used in these applications typically have larger coefficients of thermal expansion than semiconductors. Under some circumstances, this thermal strain can become sufficiently large so as to result in the fracture of the semiconductor substrate, thereby resulting in an inoperable semiconductor device(s). Additionally, a sufficiently large thermal strain between a joined semiconductor and metal substrate can result in the substrates breaking apart due to a failure at the interface. Moreover, even if the thermal strain is not sufficiently large to cause fracture in one operational cycle, fracture can still result after many operational cycles (e.g., power on for some period of time with a resultant increase in heating and thermal stain, followed by a period of time with the power off and a decrease in heating and thermal strain, followed by a period of time with power on again with a resultant increase in heating and thermal strain, etc.), due to fatigue effects in the semiconductor substrate over multiple cycles of operation.

Even in cases where fracture due to fatigue does not occur, the additional strain will lower the reliability of the solid-state semiconductor devices. For example, a laser diode that is under a strain due to packaging or mounting stresses will have its bandgap in the semiconductor modified and this change in the bandgap may result in increased currents at certain locations in the device that, if sufficiently large, will overstress the material and eventually cause it to fail. In the case of light emitting devices the additional strain will result in undesirable wavelength shifts, thereby decreasing the performance of the device.

Additionally, it is known that the thermal and mechanical stresses between semiconductor substrates mounted onto metal substrates can cause the solders used to join the metal and semiconductors substrates to re-flow from the interface to other areas of the device and/or package, which can result in a number of problems, such as the electrical shorting of the device. For example as described earlier, an elevated temperature exposure combined with the stresses that the solder is exposed to due to the different coefficients of thermal expansion of the materials used in the system and the favorable wetting properties of the solder on the semiconductor and metal substrates can cause the solder to partly or completely melt and re-flow to other areas of the device or package, or both. In some instances, this solder may re-flow to locations that cause an electrical shorting between parts of the device meant to be electronically isolated thereby resulting in catastrophic failure of the device. Solder re-flow may also result in the solder material encroaching and obstructing into sensitive locations of the device. For example, the solder may re-flow to the output facet of a light emitting device, such as a laser diode, thereby decreasing the amount of laser radiation emanating from the laser diode.

Alternatively, or in addition to these phenomena, the solder layer(s) used for joining metal to semiconductor substrates can re-flow away from the areas where electrical current is flowing and voltage potential is applied, thereby resulting in an open circuit condition, as well as other serious and negative effects on the semiconductor device(s).

For example, consider the situation of a semiconductor substrate containing active device(s) which has been soldered to a metal substrate that serves two functions, i.e., it provides electrical connection to the semiconductor substrate on the plane of the semiconductor onto which the metal is mated and it serves as a heat sink to move heat away from the semiconductor substrate. If the solder re-flows from the interface between the metal and semiconductor substrates, the result could be the creation of voids at certain locations and an accompanying increase in the electrical resistance across the metal to semiconductor interface in locations where the solder is no longer present. As a result, the current flowing between the metal and semiconductor substrates will be inhibited at the locations where solder is absent, whereas the current will become concentrated in the locations where the solder remains. This will increase the average electrical resistance over the area for which the two substrates are mated. Moreover, in the locations where the solder has moved away from the interface, thereby forming voids in the electrical continuity at the metal to semiconductor junction, the re-flow process, if left to continue, can eventually result in an open-circuit condition of the device. Furthermore, in the locations where the current is concentrated, the temperature of the interface will rise, thereby causing more solder to re-flow and consequently reinforcing the process to continue or even accelerate it, with the eventual result that the semiconductor device(s) fails to operate. Similarly, if the solder re-flows from the interface between the metal and semiconductor substrates, the result may be an increase in the thermal resistance at the location where the solder is no longer present. As a result, the temperature of the semiconductor device(s) will rise since the heat cannot be transferred as effectively away from the semiconductor substrate. Thereupon, the interface temperature will continue to rise, thereby causing more solder to re-flow, and so on. Consequently, a positive feedback process is established whereby the semiconductor device and substrate heating reinforces the solder migration, which causes additional temperature rise in the semiconductor, with the eventuality that the semiconductor fails to operate.

Even for semiconductor devices where the result is not catastrophic failure, overheating caused by solder re-flow can have very serious consequences for the reliability of the semiconductor device(s). Many types of semiconductor devices have reliabilities that degrade exponentially with increases in operational temperatures according to an Arrenhius equation given by:

$$k = Ae^{-Ea/RT}, \qquad (1)$$

where k is the rate constant (in this case the rate of failure), A is a frequency factor, $E_a$ is an activation energy (in units kJ/mol), R is a constant equal to 0.00831 (in units kJ/mol/K), and T is the temperature (in units K). Therefore, it can be seen that as the temperature rises, the rate of failure increases exponentially.

Therefore, for some devices, even relatively small temperature increases (e.g., a few degrees Celsius), can result in a very large decrease in device reliability. Therefore, any phenomena resulting in even a slight over-temperature of the semiconductor devices will have significant and negative effects on the semiconductor device reliability.

Even if other materials, such as adhesives, epoxies, glues, etc., are used to join or attach a semiconductor substrate to a metal substrate, there can be appreciable and undesired stresses in the semiconductor substrates partially or totally as a result of the large thermal expansion coefficient mis-match between most metallic materials and semiconductors. Additionally, adhesives tend to shrink when they cure, which also can lead to significant stresses and strains in the semiconductor substrate and the associated increase in problems with reliability and failures.

Consequently, this is an enormous opportunity for a new set of metal or metal alloy materials that are better matched in their values of thermal expansion coefficients to that of many of the semiconductor materials used in industry. Furthermore, it is highly desirable if these new metal or metal alloy materials have high electrical and thermal conductivities and that can be formed into shapes, sizes and form factors for most industrial, commercial and military applications.

SUMMARY OF THE INVENTION

The present invention relates to a new class of metal alloy materials, methods to design these materials to tailor the Coefficient of Thermal Expansion ("CTE") to a desired value, and various useful devices made from a tailorable composition of Titanium (Ti) and Tungsten (W) to form an alloy wherein the Coefficient of Thermal Expansion material properties of the alloy can be designed beforehand so that the CTE material properties of the metal alloy can be matched to a large number of important semiconductor and ceramic materials that are used to implement a large number of active devices and systems in microelectronics, photonics, power electronics, monolithic microwave integrated circuits (MMICs), Micro-Electro-Mechanical Systems (MEMS), Nano-Electro-Mechanical Systems (NEMS), thermoelectrics, etc. Specifically, Titanium and Tungsten can be alloyed together to form a metallic material wherein the content of the respective constituents can be adjusted over a large range of values so that the alloy material can be nearly perfectly matched in its Coefficient of Thermal Expansion to that of commonly used semiconductor and ceramic materials. Moreover, metal alloys of Titanium-Tungsten have excellent electrical and thermal conductivities making them ideal material choices for many electrical, photonic, packaging and MEMS applications.

The metal alloy material of the present invention offers many advantages over existing metallic materials including: (1) the TiW metal alloy is composed of two metals and therefore will have both an excellent thermal and electrical conductivity; (2) the percentage ratio of Titanium and Tungsten in the TiW alloy can be varied over a large range thereby allowing the coefficient of thermal expansion also to be varied over a range of values and matched to the CTEs many useful semiconductors and ceramic materials; and (3) an alloy of Titanium and Tungsten can be shaped, formed and machined into almost nearly any type of product and at relatively low cost. Consequently, the metal material alloy of the present invention has many applications for packages, heat sinks, thermal spreaders, and electrodes for devices and systems in the microelectronics, photonics, power electronics, monolithic microwave integrated circuits (MMICs), thermoelectrics, Micro-Electro-Mechanical Systems (MEMS), and Nano-Electro-Mechanical Systems (NEMS) industries.

The present invention can be used for device fabrication, systems integration, as well as for packaging of devices, and is very useful for many applications since it can reduce the thermal stresses between semiconductor substrates in which active device(s) are made and the metal or ceramic substrates used for mounting or packaging of semiconductor substrates. Moreover, the present invention decreases the fabrication and packaging complexity and cost for a large and increasing number of semiconductor-based devices and systems.

Importantly, the present invention reduces the thermal resistance from a power dissipating semiconductor device(s) to the metal substrate that the semiconductor substrate that may be serving as a heat sink, thereby allowing the temperature of the active semiconductor device(s) to be better thermally managed. Specifically, the semiconductor device may be kept at lower operational temperatures for a given power dissipation. This has the benefit of improving the manufacturing yield and reliability of semiconductor devices in operational use.

The present invention can also be used to make low electrical resistance contacts between a metal substrate material and a semiconductor substrate material, thereby allowing voltage and/or current to be directly applied to the semiconductor device(s). The present invention encompasses methods to increase the reliability and/or power of semiconductor devices, as well as enabling individual addressability and enhanced operational control through the merging of different semiconductor and metal substrates or different material types.

The present invention involves the method to "design" or "tune" the metal alloy to exactly match the thermal expansion coefficient of the metal alloy to that of a chosen semiconductor substrate material.

The present invention further provides a number of useful applications involving semiconductor device(s).

The present invention also provides a means for creating a metal alloy material that is nearly perfectly matched in thermal expansion coefficient to that of a selected semiconductor substrate, and that provides a low electrical and thermal resistance.

The present invention is also directed at improved methods to merge a semiconductor substrate containing active devices with a metal substrate to facilitate better cooling, higher performance, and improved reliability of the devices.

The present invention provides methods by which various heat sinks, electrodes, and packaging configuration can be implemented for a large variety of applications.

DETAILED DESCRIPTION OF THE INVENTION

In many electronic, microelectronic, photonic, MEMS, MMIC, power electronics, NEMS, nanotechnology, thermoelectric and other similar applications of semiconductor devices in the commercial and military sectors, the semiconductor substrate into which the active device(s) are made is attached, joined, or bonded to a metallic substrate. There are a variety of benefits derived from mounting a semiconductor substrate on a metallic substrate, including: (1) metallic materials having high thermal conductivities, to thereby efficiently conduct heat away from the semiconductor substrate during operation by allowing the metallic substrate to function as a heat sink or heat spreader; (2) the high electrical conductivity of metallic materials that allows the metallic substrate to function as an electrode to the semiconductor substrate, thereby allowing current and voltage to be applied to the semiconductor device(s) to enable them to operate; and (3) the metal substrate providing mechanical strength to the semiconductor substrate, which tends to be relatively fragile.

However, the mating of two dissimilar material substrates, such as a semiconductor substrate to a metallic substrate, can result in large built-in stresses and strains between in the substrates, if the coefficients of thermal expansion of the two materials are not equal in numerical value (i.e., "not matched"). This is particularly the case for metal and semiconductor material combinations, since metals typically have very large coefficients of thermal expansion, while semiconductors have much lower coefficients of thermal expansion.

Figure 1:
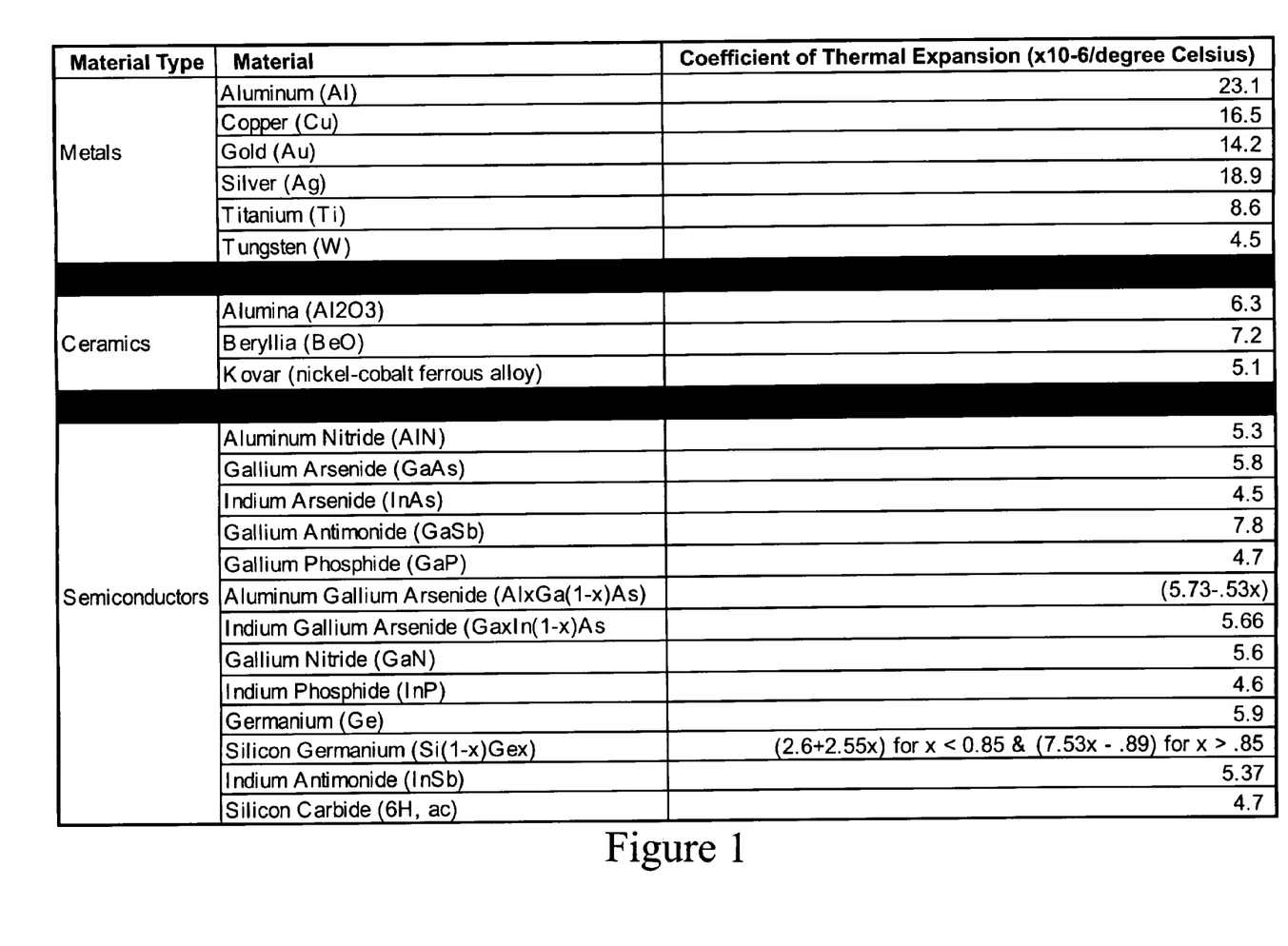
FIG. 1 is a Table of Coefficient of Thermal Expansion for a variety of metals, ceramics, and semiconductors to illustrate the differences in the values of such coefficients between metal and semiconductor materials, as well as the large range of values of such coefficients seen in commonly used material types.

FIG. 1 is a Table of the coefficients of thermal expansion for a number of commonly used metal and semiconductor materials. Of note is that the metals typically have coefficients of thermal expansion (CTE) that are relatively larger in value than those of the semiconductors. Specifically, as can be seen from FIG. 1, metals often have CTEs of over 10 ppm/degree Celsius, while semiconductors and ceramics have CTEs that mostly fall within the range of 4.5 ppm/degree Celsius to 8.0 ppm/degree Celsius.

Figure 2:
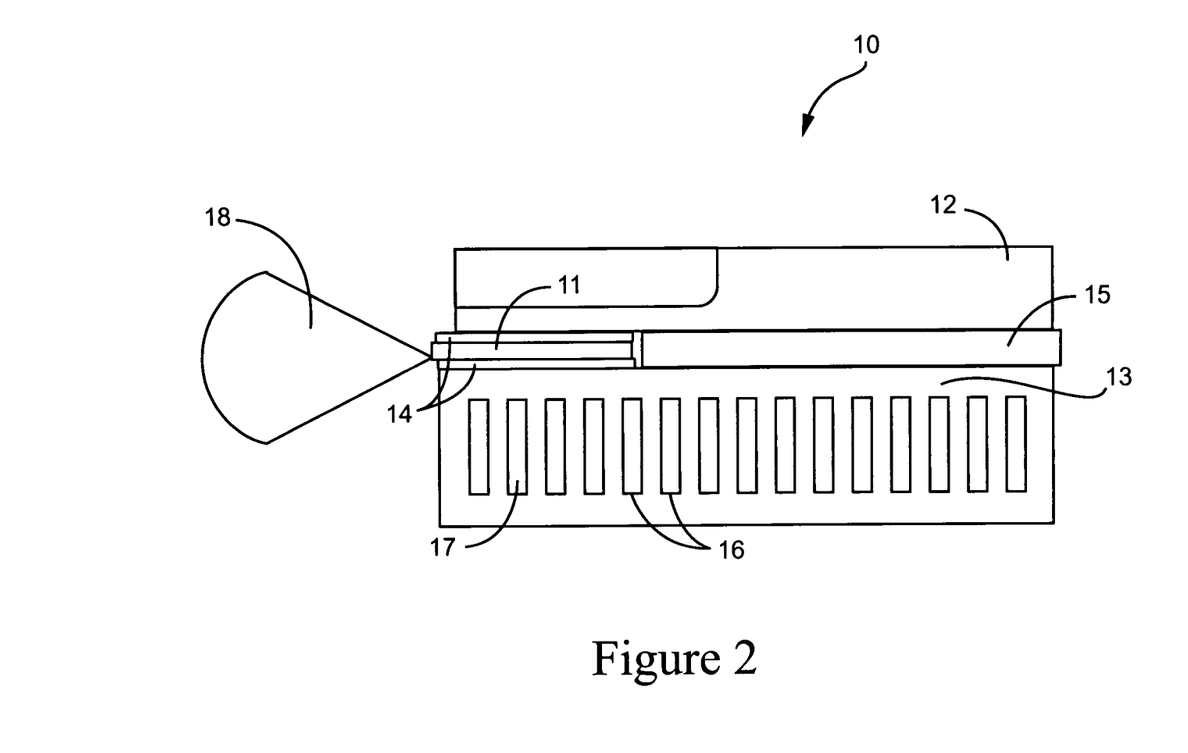
FIG. 2 is an illustration a semiconductor laser diode bar made from Gallium Arsenide (GaAs) that is mated to a metal substrate.

FIG. 2 is an illustration of an important application in which a metal substrate functions as a heat sink, wherein it is desired that the metal heat sink have a coefficient of thermal expansion that is matched to the semiconductor substrate to which it is mated. Specifically, FIG. 2 is a cross section of a device 10 in which a semiconductor laser diode bar 11 that is made from Gallium Arsenide (GaAs) is soldered to a top metal substrate 12 and a bottom metal substrate 13. Both the top metal substrate 12 and the bottom metal substrate 13 provide several functions in this application. First, both of the metal substrates (mostly the bottom metal substrate 13, and to a lesser degree, the top metal substrate 12) function as heat sinks to help remove excess heat from the laser diode bar semiconductor device 11. The laser diode bar 11, which in operation, emits a laser beam 18, dissipates a significant amount of power when operating. This results in the laser diode bar 11 reaching excessive temperatures, thereby potentially resulting in a catastrophic failure of the laser diode bar 11 or reducing the lifetime of the laser diode bar 11, if the heat cannot be removed. Second, the metal substrates also function as electrodes to the laser diode bar, with the top metal substrate 12 functioning as an n-type contact to the laser diode bar and the bottom metal substrate 13 functioning as a p-type contact to the laser diode bar. Third, the top and bottom metal substrates add additional mechanical robustness to the more fragile semiconductor substrate 11, and thereby, protect this fragile substrate from fracture.

Typically, the material chosen for the metal substrates will have a good to excellent thermal conductance to facilitate the conduction of heat away from the laser diode bar 11. Also, the material chosen for the metal substrates will have a good to excellent electrical conductivity to facilitate making electrical contact to the laser diode bar semiconductor device 11. Furthermore, it is desired that the material chosen for the metal substrates will be reasonably matched in coefficient of thermal expansion (CTE) to the CTE of the semiconductor material used in the laser diode bar 11. For example, often, it is typical to use a metal substrate 13 for this application consisting of a mixture of Copper (Cu) and Tungsten (W) when the semiconductor substrate material is Gallium Arsenide (GaAs) because the CTE of GaAs is reasonably well matched to the CTE of CuW alloy (assuming the correct formulation consisting of the respective percentages of Cu and W), and furthermore, because the thermal and electrical conductivity of a CuW alloy is also reasonably high.

Preferably, the bottom metal substrate 13 also has microchannels 16 formed in it to allow a coolant fluid 17, such as water, to pass through the substrate 13, and thereby facilitate the removal of heat away from the laser diode bar 11.

The laser diode bar 11 is soldered to the top metal substrate 12 and the bottom metal substrates 13 using an intermediate joining material of solder 14. Typically, this solder may be a combination of Gold (Au) and Tin (Sn) or Indium (In). Also, a spacer layer of an electrically insulating material 15 is inserted in a gap formed between the sandwiched laser diode bar 11 and the top and bottom metal substrates 12 and 13. Radiation emission 18 from the output facet of the device 11 is the intended output from this active device 11.

Figure 3:
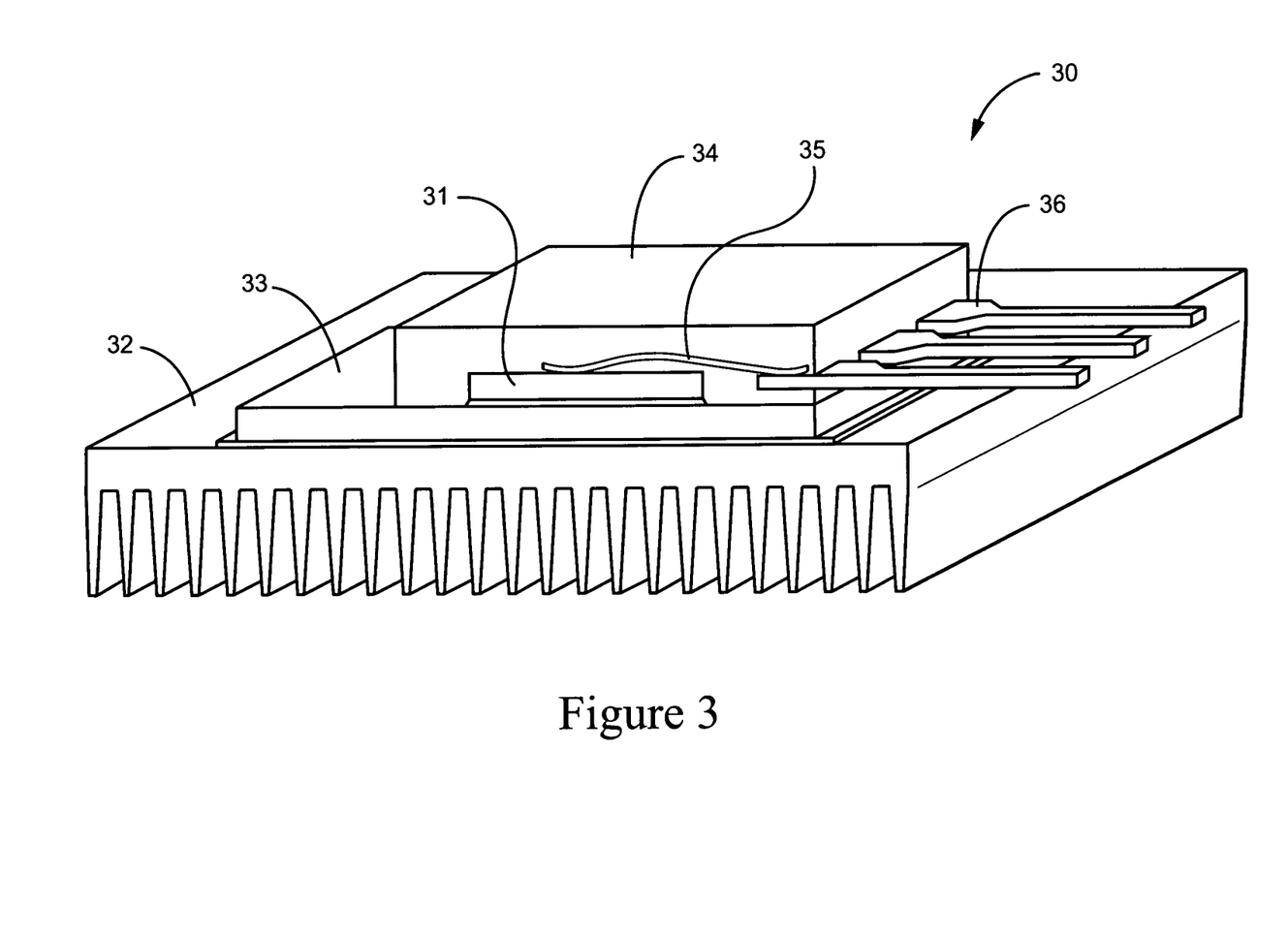
FIG. 3 is an illustration of a semiconductor power electronics substrate that is mated to a metal heat sink.

FIG. 3 is an illustration of another important application for a metal substrate, wherein it is desired that the metal substrate have a coefficient of thermal expansion that is matched to a semiconductor substrate to which it is mated. Specifically, FIG. 3 illustrates a device 30 in which a semiconductor power electronics die 31 is made from a semiconductor material which is encapsulated within a ceramic package carrier 33 and a die cover package 34. The ceramic package carrier 33 is then mated to a metal substrate 32 that functions as a mechanical support and as a heat sink/heat spreader to transport the heat away from the power semiconductor die 31. An electrical lead 35 runs from the power electronics die 31 to electrical leads 36, which are attached to electrical pads on the semiconductor die 31 and run to outside of the package 33/34. Although FIG. 3 illustrates a power semiconductor device 30, a configuration that is very similar is commonly used for another important application. Specifically, a semiconductor Monolithic Microwave Integrated Circuit (MMIC) substrate made from Gallium Arsenide (GaAs), Indium Phosphide (InP), etc. could replace the power semiconductor device 31 in FIG. 3 and be mated to a metal substrate that functions as a mechanical support and as a heat sink/heat spreader to transport the heat away from the power semiconductor device 31.

Figure 4:
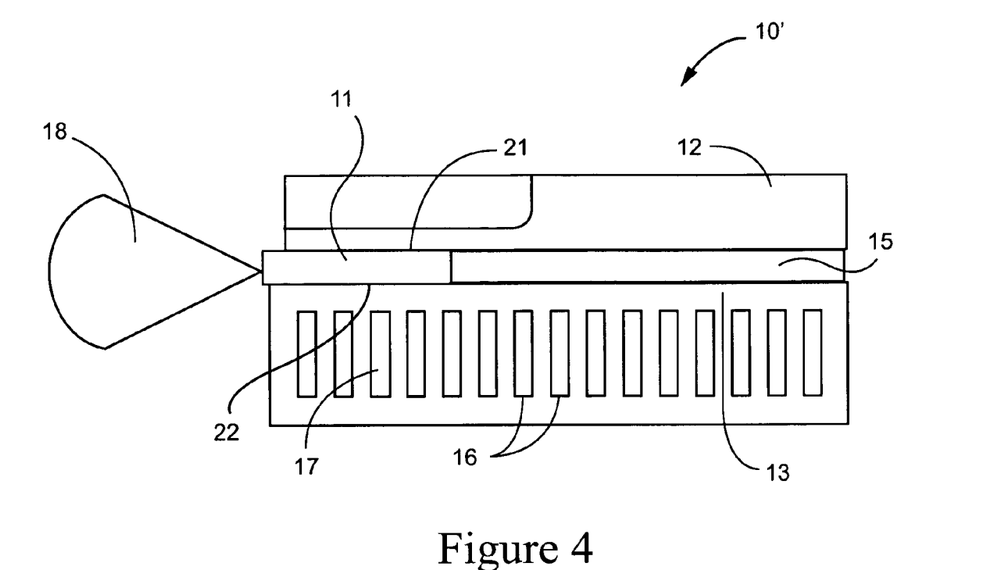
FIG. 4 is an illustration of the use of direct substrate bonding described herein to bond a semiconductor device to a metal substrate without the use of an intermediate layer such as a solder wherein the metal substrate is an alloy of Titanium and Tungsten.

FIG. 4 is an illustration of a device 10' in which direct substrate bonding is used to bond a semiconductor device, such as the laser diode bar 11 of FIG. 2, to metal substrates 12 and 13 that function as both heat sinks and as electrodes to the semiconductor device 11. In this case, the semiconductor substrate 11 is bonded to the metal substrates 12 and 13 at bonded interfaces 21 and 22, respectively, without the use of intermediate layers, such as the solder layers 14 used in the device 10 of FIG. 2. In this example, it is very important that the metal substrates 12 and 13 are nearly perfectly matched in coefficients of thermal expansion to that of the semiconductor substrate material 11. Preferably, one of the heat sinks 13 is fabricated with microchannels 16 for carrying a cooling fluid 17 that is capable of facilitating the removal of large amounts of heat from the semiconductor device 11.

Figure 5:
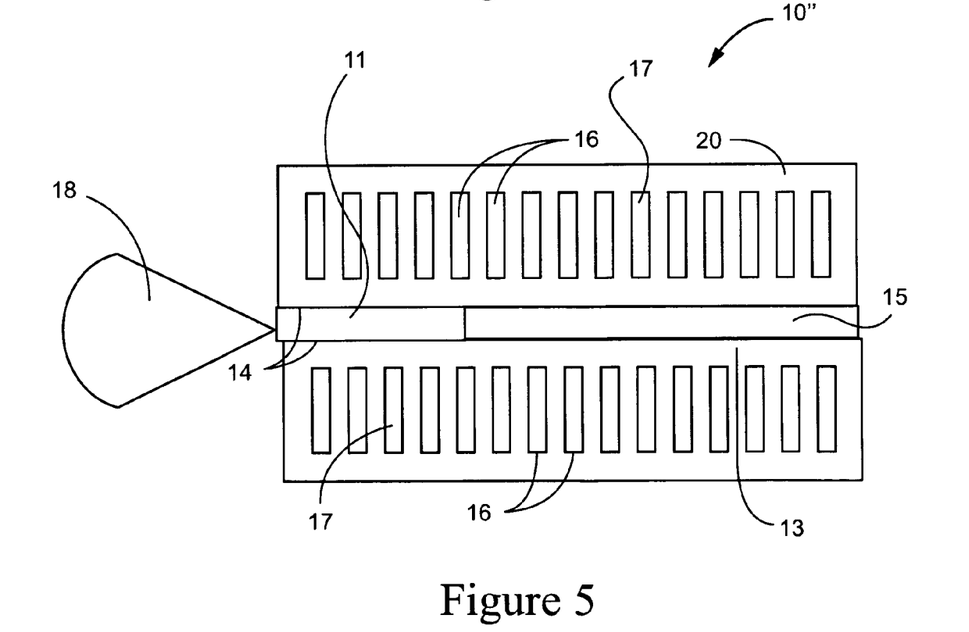
FIG. 5 is an illustration of the bonding of a silicon semiconductor microelectronics die to a metal substrate on both the top and bottom sides of the semiconductor substrate to facilitate the removal of heat from the semiconductor device(s). The metal substrates are made from an alloy of Titanium and Tungsten.

Alternatively, FIG. 5 shows a device 10" in which two heat sinks 13 and 20 that are fabricated with microchannels 16 for carrying a cooling fluid 17 for heat removal are direct bonded to both sides of the semiconductor device 11 to facilitate the removal of even larger amounts of heat from the semiconductor device 11.

Figure 6:
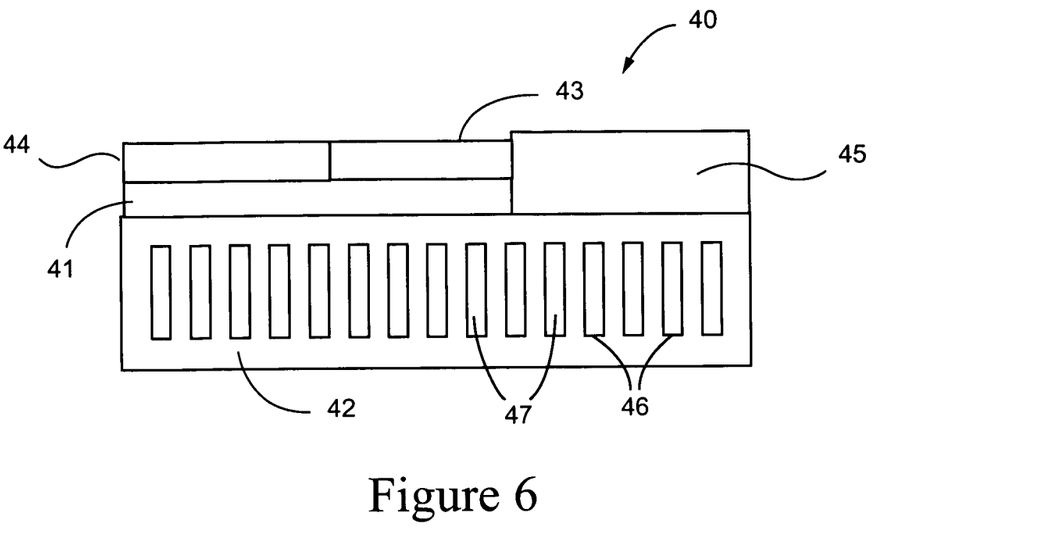
FIG. 6 is an illustration of mating of a silicon semiconductor microelectronics die to a metal substrate that is made from an alloy of Titanium and Tungsten, and also the mating different types of semiconductor substrates with different functionalities such as photonics, MEMS, and microelectronics to semiconductor and metal substrates thereby realizing a merged technology capability.

FIG. 6 is an illustration of a device or system 40 that uses merged technologies, in which a silicon semiconductor microelectronics die 41 is mated to a metal substrate 42 and also to different types of semiconductor substrates with different functionalities, such as a photonic device substrate 43 and a MEMS device substrate 44, to thereby realize a merged technology capability. In this example, the photonics device 43 may be mated to the silicon integrated circuits microelectronics die 41 for controlling the photonics device 43, which, in turn, is mated to a MEMS device 44 that actively shutters the light propagating from the photonics substrate 43. These semiconductors are mated onto the metal substrate 42, which functions as both a heat sink and as an electrode to the semiconductor substrates. Also adjacent to metal substrate 42 and semiconductor substrates 41 and 43 are insulating material 45. As before, the heat sinks 42 can be fabricated with microchannels 46 for carrying a cooling fluid 47 that is capable of facilitating the removal of large amounts of heat from the device 40.

Figure 7:
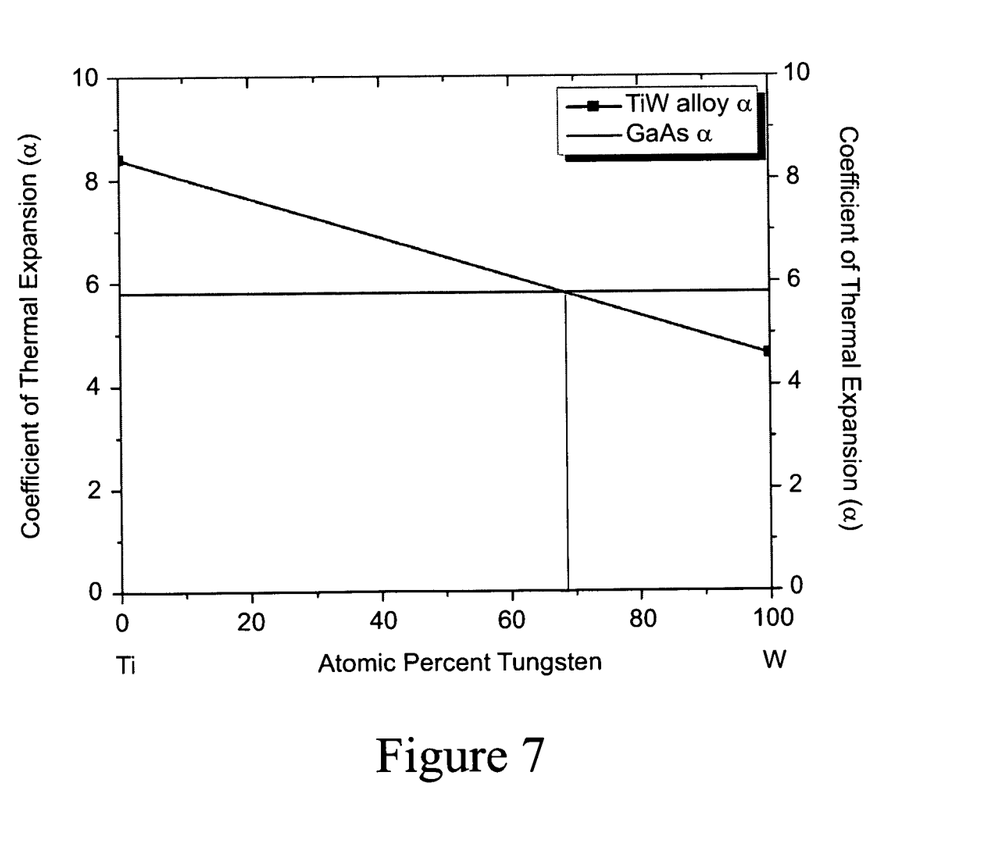
FIG. 7 is a graph illustrating how the coefficient of thermal expansion can be tailored over a range of values by varying the relative percentages of Titanium and Tungsten in the metal alloy.

FIG. 7 is a graph illustrating how the coefficient of thermal expansion can be tailored over a range of values by varying the relative atomic percentages of Titanium and Tungsten in the metal alloy. Specifically, when the atomic volumes of the atoms in an alloy are close in value, the resultant coefficient of thermal expansion of a metallic alloy composed of two metal elemental materials can be estimated by a simple equation given by:

$$\alpha = \sum_i \alpha_i V_i$$

where $\alpha$ is the resultant coefficient of thermal expansion of the alloy, $\alpha_i$ is the coefficient of thermal expansion of the individual metal element i, and $V_i$ is the volume fraction of each atom in the alloy. According to this so-called "Rule of Mixtures", the coefficient of thermal expansion for the TiW alloy can be varied over a range from approximately 8.6 ppm/Celsius to about 4.5 ppm/Celsius by simply varying the relative amounts of the two component metals forming an alloy. Furthermore, using this rule, the coefficient of thermal expansion of the alloy can be designed and made to match the coefficient of thermal expansion of many materials having a coefficient of thermal expansion falling within this range of values.

For example, shown in FIG. 7 is the coefficient of thermal expansion of GaAs, which is approximately 5.8 ppm/Celsius. It is noted that a mixture of approximately 31.6% of Titanium and 68.4% Tungsten will result in a coefficient of thermal expansion for the resulting alloy that is nearly perfectly matched to that of the GaAs material.

Figure 8:
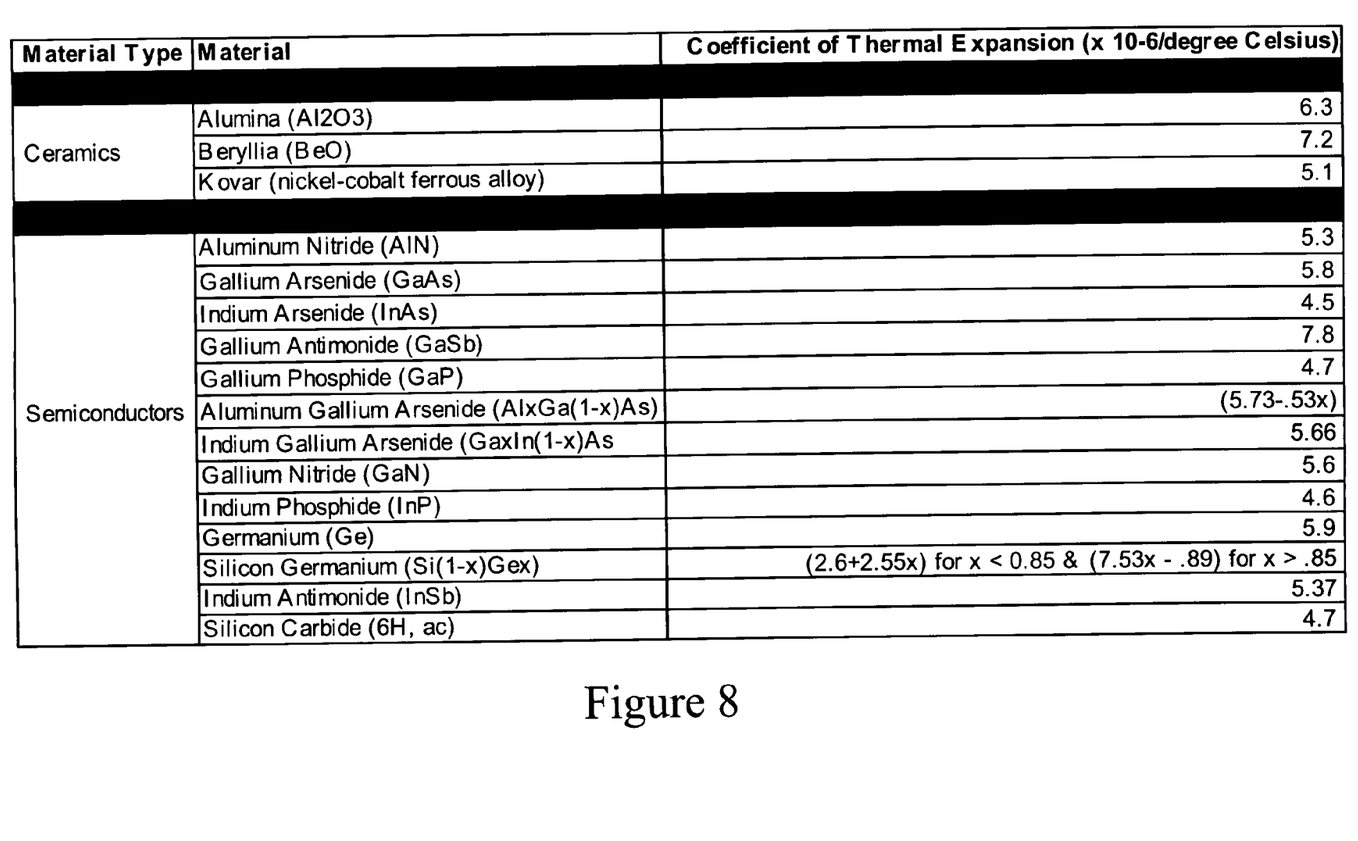
FIG. 8 is a Table showing a number of commonly used materials in the semiconductor and ceramic industry having a coefficient of thermal expansion that can be matched to an alloy of Titanium and Tungsten by varying the amount of each metal element constituents in the mixture.

Importantly, other alloys of Titanium and Tungsten can be made wherein the coefficient of thermal expansion values can range from about 8.6 ppm/Celsius to about 4.5 ppm/Celsius by simply vary the ratio of the two component metals used to form an alloy. Consequently, it can be seen that a Titanium and Tungsten alloy can be designed and made so as to match the coefficient of thermal expansion of many of the semiconductor materials commonly used in industry, as shown in the Table of FIG. 8.

Figure 9:
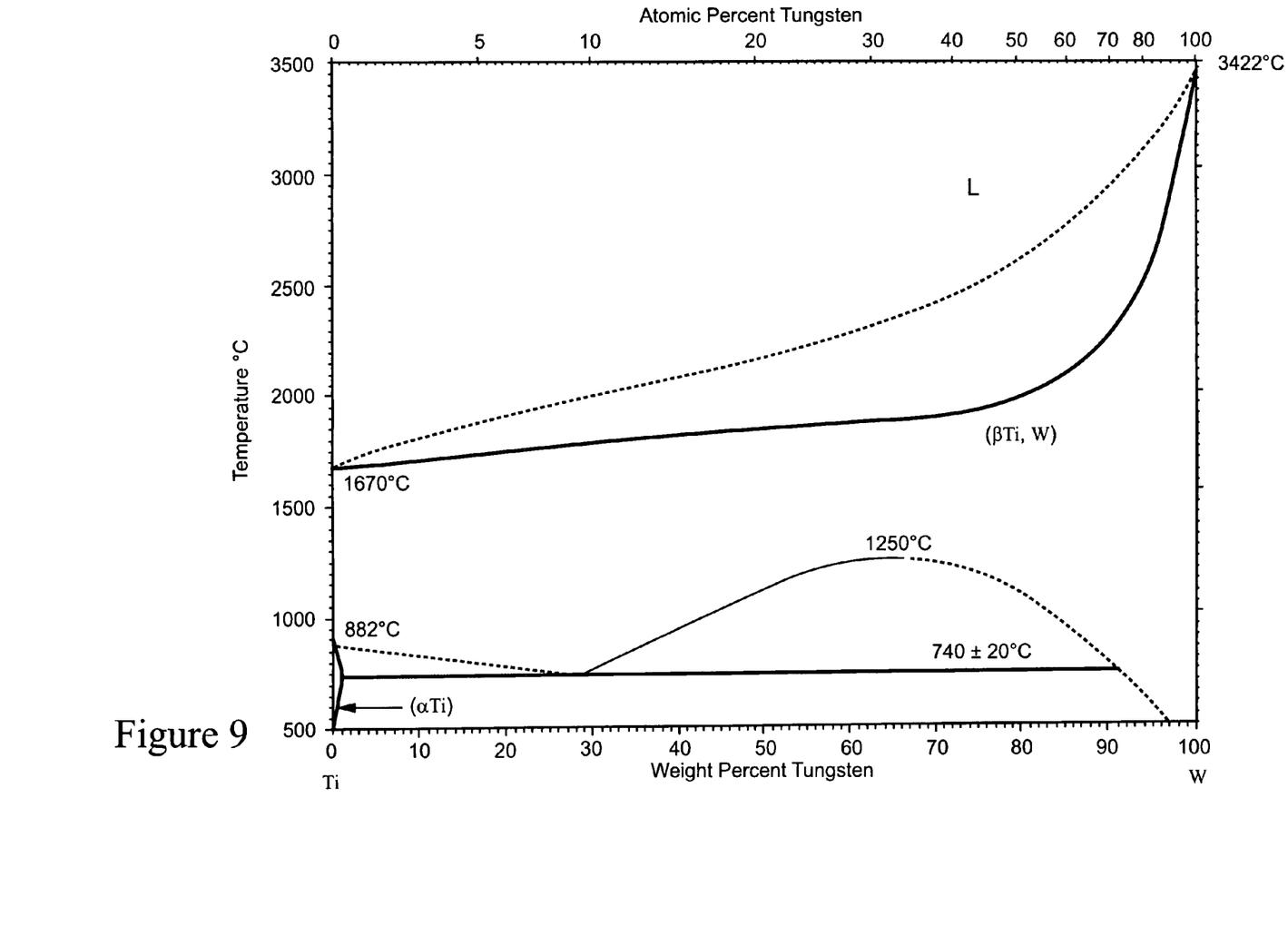
FIG. 9 is a phase diagram of Titanium and Tungsten.

FIG. 9 is a phase diagram of Titanium and Tungsten. Within the composition range of 0% to 96% Tungsten (balance Titanium), the $\alpha$- and $\beta$-Titanium phases are present in addition to a single cubic Tungsten phase. Tungsten is completely soluble in the O-Titanium phase, while limited in solubility (0.8 wt. %) in the $\alpha$-Titanium phase. The eutectoid temperature of 740 Celsius defines the stability between the $\alpha$- and $\beta$-Titanium phases so that complete Tungsten solubility can be attained at temperatures above and after when cooled to room temperature by preservation of some of the $\beta$-Titanium phase. When TiW is formed using powder metallurgy, slow cooling from above the eutectoid temperature results in a two-phase, Widmanstatten $\alpha/\beta$ structure where the major phase is the Tungsten soluble $\beta$-Titanium. If formed using vapor deposition, the alloy retains Tungsten throughout with exception to nanometer sized $\alpha$-Titanium crystal formation. The resulting length scales at which the $\alpha$-Titanium, $\beta$-Titanium, and Tungsten phases exist are dependant on processing conditions, but can easily be engineered to less than 10 micrometers. With respect to the compositional microstructure and material thermal properties, the rule of mixtures can be used with averaged numbers. Therefore using common fabrication techniques, the specific phase and localized composition will fall into a known regime and enable engineered macroscale properties by requiring only the overall Titanium-Tungsten weight percent of the alloy.

Other important material properties can be predicted using the Rule of Mixtures, such as density, thermal conductivity, electrical conductivity, specific heat, etc. For example, considering the 31.6% of Titanium and 68.4% Tungsten alloy considered above, which will be matched in coefficient of thermal expansion to that of Gallium Arsenide, the predicted thermal conductivity of this same alloy will be over 100 W/m-K.

Moreover, other important material properties can be also tailored to desired values using the Rule of Mixtures, including the density, thermal conductivity, electrical conductivity, specific heat, etc. of the alloy mixture.

A Titanium and Tungsten alloy of the present invention is an improvement over other metal material composites commonly used in the semiconductor industry for heat sinks, heat spreaders, electrodes, etc., such as Copper-Tungsten (CuW) and Molybdenum-Copper (MoCu). Specifically, the coefficient of thermal expansion for Titanium-Tungsten alloy can be tailored to match that of a large and diverse class of semiconductor material substrates. Secondly, the thermal and electrical conductivities of the Titanium-Tungsten alloy are very high over the full range of possible alloy mixtures.

Thirdly, an alloy of TiW can be machined, micro-machined, electro-discharged machined, cast, milled and polished, much more easily, to a higher degree of precision, and with a finer finish than metal composites made from sintering of powders such as Copper-Tungsten (CuW) alloys that are insoluble below the liquidus of the two-phase system. Fourth, an alloy of TiW can be formed using standard metallurgical techniques such as vapor deposition, mechanical alloying, solid-state reaction, melt spinning, ion radiation and others.

The present invention can be formed into shapes and dimensions for many heat sink and heat spreader applications requiring large heat removal from the active devices or systems. The very high thermal and electrical conductance, coupled with the ability to match the coefficient of thermal expansion of the heat sink/heat spreader with that of the semiconductor substrate containing the active devices, makes the TiW alloy of the present invention a vast improvement compared to current approaches. For example, consider the microchannel plate shown in FIG. 10, which is used to provide electrical power to high power semiconductor laser diodes as well as provide heat sinking and heat spreading capability to the semiconductor. Having a microchannel plate, which is matched in coefficient of thermal expansion to that of the laser diode semiconductor material reduces thermal stresses and strains that can result as the laser diode heats up during operational use.

Moreover, since the TiW alloy in the form of a heat sink/heat spreader electrode substrate can be polished to a very high degree of surface flatness and smoothness, this material can be directly bonded to a semiconductor material substrate without the use of any intermediate joining, gluing, or solder layer(s) between the two substrates. That is, the presently described invention can be used for device fabrication as well as for packaging of devices and is very useful for many applications since it can obtain a lower thermal resistance across heterogeneous material interfaces, it can obtain a low electrical resistance across a metal to semiconductor interface, it greatly reduces thermal strain across heterogeneous material interfaces, and it can reduce fabrication and packaging complexity, as well as cost for a large and increasing number of photonic, electronic, MEMS, NEMS, MMIC, power electronic, thermoelectric, and nanotechnology devices and systems.

Figure 10:
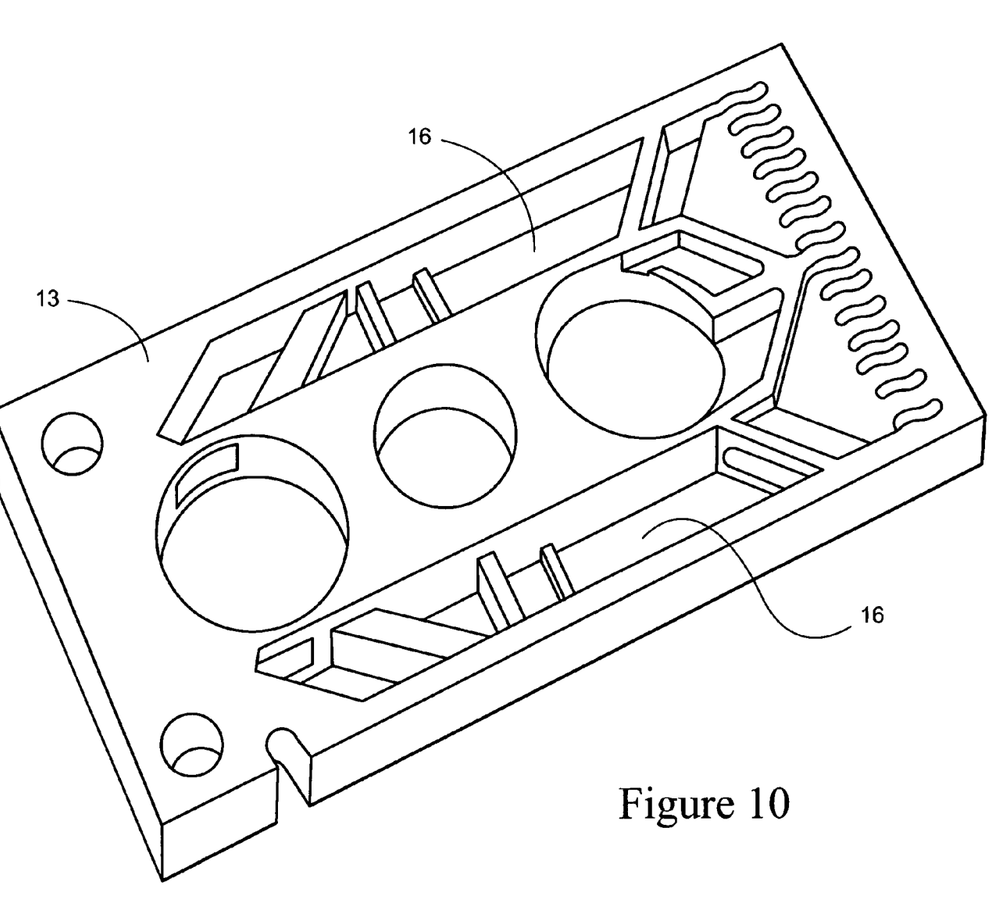
FIG. 10 is a top perspective of a microchannel plate used for a laser diode application.

FIG. 4 is an example of a TiW metal substrate 13 made according to the present invention being bonded to a GaAs laser diode semiconductor substrate 11. The semiconductor substrate 11 is a laser diode or a laser diode array. The TiW metal substrate 13 is bonded to the GaAs substrate and functions as a p-type electrical contact and also as a heat sink. The bonding process described above is used to bond the GaAs substrate 11 to the metal electrode/substrate 13 on the bottom, and/or the metal electrode 12 on the top of substrate 11. As shown, the heat sink substrate 13 has microchannels 16 made in it, allowing water or some other cooling fluid 17 to be forced through the channels 16 in order to facilitate the removal of heat from the laser diodes. FIG. 10 is a to perspective view of microchannel plate, such as metal substrate 13, used for a laser diode application. The plate 13 includes microchannels 16 within which the cooling fluid 17 for heat removal would be located. The interface 21 and 22 between the semiconductor 11 and metal substrates 12 and 13, respectively in this example need to be electrically conductive in order to allow current to cross the semiconductor and metal interfaces. Moreover, the thermal conductance across the semiconductor and metal interfaces is desired to be as high as possible. Given the potentially large difference in thermal expansion coefficient between the GaAs semiconductor substrate 11 into which the laser diodes are made and the metal substrates 12 and 13, which function as an electrode and/or heat sink, it is desirable that the coefficients of thermal expansion for the semiconductor 11 and metal substrates 12 and 13 are identical or nearly identical, and this can be achieved with the present invention.

Using the present invention is it possible to machine cooling fins into the surface of the metal alloy substrate to facilitate the removal of heat away from the semiconductor device attached to the metal alloy substrate.

FIG. 5 illustrates another configuration that is part of this invention wherein metal substrates 13 and 20 are bonded to both sides (i.e., top and bottom) of the laser diode or laser diode array 11 using the semiconductor substrate to metal substrate bonding techniques described herein and without the use of any intermediate layers for the bonding. The ability to have microchannel cooling plates 13 and 20 on both sides of the laser diode or laser diode array 11 greatly facilitates the removal of heat from the device during operation, to thereby improve its performance and reliability. Moreover, the bonding of the metal substrates 13 and 20 directly to the semiconductor 11, without the use of an intermediate soldering layer, reduces the thermal resistance across the interface between the two substrates and also eliminates the problems of solder re-flow described above.

It is also possible to fabricate various cooling technologies, such as cooling fins, heat pipes, capillary pumped loops, 2-phase cooler, spray coolers, refrigeration capability, etc. into a metal alloy substrate made according to the present invention.

FIG. 6 illustrates the use of the present invention described herein to form a complex system 40 that combines one or more semiconductor substrates or dies 41/43/44 with one or more metal substrates 42. As discussed above, the semiconductor substrates 41/43/44 could have any number of technologies fabricated into them, including microelectronics, photonics, MMIC, power electronics, thermoelectrics, and/or MEMS, and the metal substrate(s) 42 can have one or more functions, including: a mechanical support; a heat sink (with cooling fins, heat pipes, capillary pumped loops, 2-phase cooler, spray coolers, etc.); electrodes to supply current and/or voltage to the semiconductor devices; and metal shielding to protect the active devices made in the semiconductor substrates. As shown in FIG. 6, a semiconductor substrate 43 with photonic devices fabricated in it is bonded to a semiconductor silicon substrate 41 with microelectronics fabricated in it, and likewise a semiconductor or metal substrate 44 with MEMS device(s) fabricated in it is bonded to the microelectronics substrate 41. This composite stack of three substrates, a photonics substrate, a microelectronics substrate, and a MEMS substrate, is then bonded to a metal substrate 42 on the bottom and possibly a second metal substrate on the top. In this configuration, the metal substrates act as heat sinks and as electrodes. It is understood that the configuration illustrated in FIG. 6 is only one of many possible configurations and that the present invention, whereby multiple semiconductor and metal substrates can be bonded together to form complex systems, covers all of these possible configurations.

Another considerable benefit of the present invention allows a significant increase in the reliability of semiconductor devices, for example laser diodes and especially high-power laser diodes, as well as enabling individual addressability and enhanced operational control of semiconductor devices through the merging of different semiconductor and metal substrates or different material types. Moreover, methods are described by which additional capability can be used on both sides of laser diodes and laser diode arrays to obtain more effective thermal control and/or higher performance.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A method of forming a metal alloy with a first coefficient of thermal expansion that can be directly attached, joined or bonded to a semiconductor or ceramic material, the metal alloy's first coefficient of thermal expansion substantially matching a second coefficient of thermal expansion of the semiconductor or ceramic material prior to the metal alloy being directly attached, joined or bonded to the semiconductor or ceramic material, the method comprising the steps of:
   selecting a semiconductor or ceramic material,
   determining the second coefficient of thermal expansion of the selected semiconductor or ceramic material prior to the metal alloy being directly attached, joined or bonded to the semiconductor or ceramic material,
   forming the metal alloy using a composition of titanium and tungsten in which relative percentages of titanium and tungsten in the metal alloy are selected so that the first coefficient of thermal expansion of the metal alloy prior to being directly attached, joined or bonded the semiconductor or ceramic material substantially matches the second coefficient of thermal expansion of the selected semiconductor or ceramic material prior to the metal alloy being directly attached, joined or bonded to the semiconductor or ceramic material, and
   wherein the titanium and tungsten alloy being a binary metal compound only.

2. The method of claim 1, wherein the relative percentages of titanium and tungsten in the metal alloy are selected according to an equation given by:

$$\alpha = \sum_i \alpha_i V_i$$

where $\alpha$ is the resultant coefficient of thermal expansion of the metal alloy, $\alpha_i$ is the coefficient of thermal expansion of the individual metal element i, and $V_i$ is the volume fraction of each atom in the alloy.

3. The method of claim 1, wherein the second coefficient of thermal expansion for the metal alloy is varied over a range from approximately 8.6 ppm/Celsius to about 4.5 ppm/Celsius by varying the relative amounts of the titanium and tungsten used to form the metal alloy.

4. The method of claim 1, wherein the semiconductor or ceramic material contains at least one active device or system selected from a group consisting of microelectronics, photonics, power electronics, monolithic microwave integrated circuits, microelectro-mechanical systems, nano-electro-mechanical systems, and thermo-electrics.

5. The method of claim 4, wherein the metal alloy is a heat sink that is joined to the semiconductor or ceramic material and that removes excess heat from the semiconductor or ceramic substrate.

6. The method of claim 1, wherein the semiconductor or ceramic material is a substrate containing at least one active device or system and wherein the metal alloy is a metal substrate that functions as a mechanical support and as a heat sink/heat spreader to transport heat away from the semiconductor or ceramic substrate.

7. The method of claim 6, wherein the semiconductor or ceramic substrate is bonded to the metal alloy substrate without the use of an intermediate layer.

8. The method of claim 1, wherein the alloy of titanium and tungsten is formed using powder metallurgy.

9. The method of claim 1, wherein the alloy of titanium and tungsten is formed using vapor deposition.

10. The method of claim 1, wherein the alloy of titanium and tungsten is formed using any one of the techniques including: mechanical alloying; solid-state reaction; melt spinning, and ion radiation.

11. The method of claim 1, wherein the alloy of titanium and tungsten has a fine finish that is achieved using a process selected from a group consisting of machining, micro-machining, electro-discharged machining, casting, milling and polishing.

12. The method of claim 6, wherein the heat sink has fins machined on the surface(s) not bonded to the semiconductor or ceramic substrate to facilitate the removal of heat from active devices made in a semiconductor or ceramic substrate bonded or mated to the heat sink.

13. The method of claim 6, wherein the heat sink has micro-channels in it through which water is forced to facilitate the removal of heat from a laser diode or an array of laser diodes.

14. The method of claim 6, wherein the heat sink has active cooling or refrigeration capability built into it to facilitate the removal of heat from semiconductor or ceramic substrate.

15. The method of claim 6, wherein the semiconductor or ceramic substrate contains a laser diode or an array of laser diodes, and wherein the heat sink has micro-channels in it through which water is forced to facilitate the removal of heat from the laser diode or array of laser diodes.

16. The method of claim 11, wherein the surface of the metal alloy substrate is polished prior to bonding to the semiconductor or ceramic substrate.

17. The method of claim 6, wherein the metal alloy substrate is a device selected from a group consisting of a mechanical support, a heat sink, at least one electrode to supply current and/or voltage to active devices or systems on the semiconductor or ceramic substrate, and a metal shield to protect active devices formed on the semiconductor or ceramic substrate.

18. A method of forming a metal alloy with a first coefficient of thermal expansion that can be directly attached, joined or bonded to a semiconductor or ceramic material, the metal alloy's first coefficient of thermal expansion substantially matching a second coefficient of thermal expansion of the semiconductor or ceramic material prior to the metal alloy being directly attached, joined or bonded to the semiconductor or ceramic material, the method comprising the steps of:
   selecting a semiconductor or ceramic material,
   determining the second coefficient of thermal expansion of the selected semiconductor or ceramic material prior to the metal alloy being directly attached, joined or bonded to the semiconductor or ceramic material,
   forming the metal alloy using a composition of titanium and tungsten in which relative percentages of titanium and tungsten in the metal alloy are selected so that the first coefficient of thermal expansion of the metal alloy prior to being directly attached, joined or bonded to the semiconductor or ceramic material substantially matches the second coefficient of thermal expansion of the selected semiconductor or ceramic material prior to the metal alloy being directly attached, joined or bonded to the semiconductor or ceramic material, the relative percentages of titanium and tungsten in the metal alloy being selected according to an equation given by:

$$\alpha = \sum_i \alpha_i V_i$$

where α is the resultant coefficient of thermal expansion of the metal alloy, a $\alpha_i$ is the coefficient of thermal expansion of the individual metal element i, and $V_i$ is the volume fraction of each atom in the alloy, and wherein the titanium and tungsten alloy being a binary compound only.

19. The method of claim 18, wherein the second coefficient of thermal expansion for the metal alloy is varied over a range from approximately 8.6 ppm/Celsius to about 4.5 ppm/Celsius by varying the relative amounts of the titanium and tungsten used to form the metal alloy.

20. The method of claim 18, wherein the semiconductor or ceramic material contains at least one active device or system selected from a group consisting of microelectronics, photonics, power electronics, monolithic microwave integrated circuits, microelectro-mechanical systems, nano-electro-mechanical systems, and thermo-electrics.

21. The method of claim 18, wherein the metal alloy is a heat sink that removes excess heat from the semiconductor or ceramic substrate.

22. The method of claim 18, wherein the semiconductor or ceramic material is a substrate containing at least one active device or system and wherein the metal alloy is a metal substrate that functions as a mechanical support and as a heat sink/heat spreader to transport heat away from the semiconductor or ceramic substrate.

23. The method of claim 22, wherein the semiconductor or ceramic substrate is bonded to the metal alloy substrate without the use of an intermediate layer.

24. The method of claim 18, wherein the alloy of titanium and tungsten is formed using powder metallurgy.

25. The method of claim 18, wherein the alloy of titanium and tungsten is formed using vapor deposition.

26. The method of claim 18, wherein the alloy of titanium and tungsten is formed using any one of the techniques including: mechanical alloying; solid-state reaction; melt spinning, and ion radiation.

27. The method of claim 18, wherein the alloy of titanium and tungsten has a fine finish that is achieved using a process selected from a group consisting of machining, micro-machining, electro-discharged machining, casting, milling and polishing.

28. The method of claim 22, wherein the heat sink has fins machined on the surface(s) not bonded to the semiconductor or ceramic substrate to facilitate the removal of heat from active devices made in a semiconductor or ceramic substrate bonded or mated to the heat sink.

29. The method of claim 22, wherein the heat sink has micro-channels in it through which water is forced to facilitate the removal of heat from a laser diode or an array of laser diodes.

30. The method of claim 22, wherein the heat sink has active cooling or refrigeration capability built into it to facilitate the removal of heat from semiconductor or ceramic substrate.

31. The method of claim 22, wherein the semiconductor or ceramic substrate contains a laser diode or an array of laser diodes, and wherein the heat sink has micro-channels in it through which water is forced to facilitate the removal of heat from the laser diode or array of laser diodes.

32. The method of claim 27, wherein the surface of the metal alloy substrate is polished prior to bonding to the semiconductor or ceramic substrate.

33. The method of claim 22, wherein the metal alloy substrate has one or more functions including a mechanical support, a heat sink, electrodes to supply current and/or voltage to active devices or systems on semiconductor substrate, and metal shielding to protect active devices made in the semiconductor substrate.

34. A method of forming a metal alloy substrate with a first coefficient of thermal expansion that can be directly attached, joined or bonded to a semiconductor or ceramic material substrate, the metal alloy's first coefficient of thermal expansion substantially matching a second coefficient of thermal expansion of the semiconductor or ceramic material substrate to which the metal alloy is joined prior to the metal alloy being directly attached, joined or bonded to the semiconductor or ceramic material substrate, the method comprising the steps of:

selecting a semiconductor or ceramic material substrate, determining the second coefficient of thermal expansion of the selected semiconductor or ceramic material substrate prior to the metal alloy being directly attached, joined or bonded to the semiconductor or ceramic material substrate, forming the metal alloy using a composition of titanium and tungsten in which relative percentages of titanium and tungsten in the metal alloy are selected so that the first coefficient of thermal expansion of the metal alloy prior to being directly attached, joined or bonded to the semiconductor or ceramic material substrate substantially matches the second coefficient of thermal expansion of the selected semiconductor or ceramic material substrate prior to the metal alloy being directly attached, joined or bonded to the semiconductor or ceramic material substrate, the relative percentages of titanium and tungsten in the metal alloy being selected according to an equation given by:

$$\alpha = \sum_i \alpha_i V_i$$

where α is the resultant coefficient of thermal expansion of the metal alloy substrate, $\alpha_i$ is the coefficient of thermal expansion of the individual metal element i, and $V_i$ is the volume fraction of each atom in the alloy, the semiconductor or ceramic material substrate containing at least one active device or system, the metal alloy being a heat sink that removes excess heat from the semiconductor or ceramic substrate, and thus, the at least one active device or system, and wherein the titanium and tungsten alloy being a binary metal compound only.

* * * * *